(12) United States Patent
Akahori et al.

(10) Patent No.: US 6,727,182 B2
(45) Date of Patent: *Apr. 27, 2004

(54) PROCESS FOR THE PRODUCTION OF SEMICONDUCTOR DEVICE

(75) Inventors: Takashi Akahori, Hachioji (JP); Shuichi Ishizuka, Tsukui-Gun (JP); Shunichi Endo, Sagamihara (JP); Takeshi Aoki, Hachioji (JP); Tadashi Hirata, Sagamihara (JP)

(73) Assignee: Tokyo Electron Limited, Tokyo-To (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 53 days.

(21) Appl. No.: 09/101,308
(22) PCT Filed: Nov. 11, 1997
(86) PCT No.: PCT/JP97/04099
  § 371 (c)(1),
  (2), (4) Date: Oct. 15, 1998
(87) PCT Pub. No.: WO98/21745
  PCT Pub. Date: May 22, 1998

(65) Prior Publication Data
  US 2001/0001741 A1 May 24, 2001

(30) Foreign Application Priority Data
  Nov. 14, 1996 (JP) ................................. 8-320912

(51) Int. Cl.⁷ .......................................... H01L 21/302
(52) U.S. Cl. ....................... 438/710; 438/706; 438/709
(58) Field of Search .................................. 438/710, 709, 438/706

(56) References Cited

U.S. PATENT DOCUMENTS

| 5,442,237 A | | 8/1995 | Hughes et al. |
| 5,489,538 A | * | 2/1996 | Rostoker et al. ............... 438/15 |
| 5,498,657 A | * | 3/1996 | Sugiyama et al. ........... 524/463 |
| 5,594,259 A | * | 1/1997 | Shimada et al. ............... 257/66 |

(List continued on next page.)

FOREIGN PATENT DOCUMENTS

| JP | 55-107781 | 8/1980 |
| JP | 61099332 | 5/1986 |

(List continued on next page.)

OTHER PUBLICATIONS

Wolf, S. and Tauber, R.N., Silicon Processing for the VLSI Era, vol. 1, pp. 539–549.*

(List continued on next page.)

Primary Examiner—Felisa Hiteshaw
(74) Attorney, Agent, or Firm—Smith, Gambrell & Russell, LLP

(57) ABSTRACT

It is an object of the present invention to provide a process for a fluorine containing carbon film (a CF film), which can put an interlayer insulator film of a fluorine containing carbon film into practice. A conductive film, e.g., a TiN film 41, is formed on a CF film 4. After a pattern of a resist film 42 is formed thereon, the TiN film 41 is etched with, e.g., $BCl_3$ gas. Thereafter, when the surface of the wafer is irradiated with $O_2$ plasma, the CF film is chemically etched, and the resist film 42 is also etched. However, since the TiN film 41 functions as a mask, a predetermined hole can be formed. Although an interconnection layer of aluminum or the like is formed on the surface of the CF film 4, the TiN film 41 functions as an adhesion layer for adhering the interconnection layer to the CF film 4 and serves as a part of the interconnection layer. As the mask, an insulator film of $SiO_2$ or the like may be substituted for the film.

3 Claims, 7 Drawing Sheets

U.S. PATENT DOCUMENTS

| | | | | |
|---|---|---|---|---|
| 5,654,228 | A | * | 8/1997 | Shieh et al. .................... 438/32 |
| 5,698,901 | A | * | 12/1997 | Endo .......................... 257/758 |
| 5,733,808 | A | * | 3/1998 | Tseng .......................... 438/239 |
| 5,763,324 | A | * | 6/1998 | Nogami ...................... 438/675 |
| 5,840,455 | A | * | 11/1998 | Ikuno et al. .................. 430/67 |
| 5,854,134 | A | * | 12/1998 | Lan et al. .................... 438/695 |
| 5,866,920 | A | * | 2/1999 | Matsumoto et al. .......... 257/63 |
| 5,905,517 | A | * | 5/1999 | Silverbrook ................. 347/61 |
| 5,916,730 | A | * | 6/1999 | Ide et al. ............... 430/270.13 |
| 6,066,893 | A | * | 5/2000 | Wise .......................... 257/751 |
| 6,091,081 | A | * | 7/2000 | Matsubara et al. ........... 257/52 |

FOREIGN PATENT DOCUMENTS

| | | |
|---|---|---|
| JP | 61-218134 | 9/1986 |
| JP | 62-43335 | 12/1987 |
| JP | 63-233549 | 9/1988 |
| JP | 3-3380 | 1/1991 |
| JP | 4-271122 | 9/1992 |
| JP | 6-53193 | 2/1994 |
| JP | 6-163479 | 6/1994 |
| JP | 6-196421 | 7/1994 |
| JP | 6-264270 | 9/1994 |
| JP | 06264270 | 9/1994 |
| JP | 8-3842 | 3/1996 |
| JP | 8-83842 | 3/1996 |
| JP | 8-236517 | 9/1996 |
| WO | 96/12048 | 4/1996 |
| WO | 96/19826 | 6/1996 |

OTHER PUBLICATIONS

H. Kudo, et al., "Characteristics of Plasma–CF films for Very Low–k Dielectrics".

S. Takeishi, et al., "Fluorocarbon Films Deposited by PECVD with High Thermal Resistance and Low Dielectric Constants".

W. Lee, et al., "Plasma Polymerization of Low Dielectric Constant Fluorocarbon Polymer by ECR".

K. Endo, et al. "Effect of Bias Addition on the Gap–Filling Properties of Fluorinated Amorphous Carbon Thin Films Grown by Helicon Wave Plasma Enhanced Chemical Vapor Deposition".

"Applications of fluorocarbon polymers in micromechanics and micromachining"; H.V. Jansen et al. XP–002112288.

* cited by examiner

PROCESS FOR THE PRODUCTION OF SEMICONDUCTOR DEVICE

TECHNICAL FIELD

The present invention relates generally to a method for producing a semiconductor device using a fluorine containing carbon film.

BACKGROUND ART

In order to achieve high integration of a semiconductor device, it has been developed to provide devices, such as scale down of a pattern and multilayering of a circuit. As one of such devices, there is a technique for multilayering interconnection layers. In order to provide a multi layer metallization structure, a number n interconnection layer and a number (n+1) interconnection layer are connected to each other by means of a conductive layer, and a thin film called an interlayer insulator film is formed in a region other than the conductive layer.

As one of typical interlayer insulator films, there is a $SiO_2$ film. In recent years, in order to more accelerate operation of a device, it has been required to reduce the relative dielectric constant of the interlayer insulator film, and the material of the interlayer insulator film has been examined. That is, the relative dielectric constant of $SiO_2$ is about 4, and it has been diligently studied to dig up materials having a smaller relative dielectric constant than that of $SiO_2$. As one of such materials, it has been studied to put SiOF having a relative dielectric constant of 3.5 into practice. The inventor has taken notice of a fluorine containing carbon film (for example, such as a fluorocarbon film) having a still smaller relative dielectric constant.

By the way, the fluorine containing carbon film has many unknown factors, and a method for producing the fluorine containing carbon film itself has been searched. For example, in conventional etching processes, the fluorine containing carbon film can not be etched with a CF gas, such as $CF_4$, which is used as an etching gas for a $SiO_2$ film, since the film itself to be etched is a CF material. Thus, the conventional processes can not be applied directly to the fluorine containing carbon film. Therefore, although the fluorine containing carbon film is suitable for an interlayer insulator film, there are many problems in order to put an interlayer insulator film of a fluorine containing carbon film into practice.

DISCLOSURE OF THE INVENTION

It is therefore a principal object of the present invention to eliminate problems in an etching process and to enable to etch a fluorine containing carbon film to put an interlayer insulator film of a fluorine containing carbon film into practice.

The first invention of the present application is characterized by the steps of: depositing an insulator film of a fluorine containing carbon film on an object to be treated; forming a pattern of a resist film on the insulator film; and removing the resist film while etching the insulator film by an oxide plasma. Specifically, this invention includes the following steps. When a predetermined recessed portion is formed on the insulator film by etching, the resist film may remain on the insulator film. The etch rate of the fluorine containing carbon film etched by the oxide plasma may be equal to the etch rate of the resist film etched by the oxide plasma.

The second invention of the present invention is characterized by the steps of: depositing an insulator film of a fluorine containing carbon film on an object to be treated; forming a pattern of a resist film on the insulator film; and producing a plasma of a treatment gas containing an oxygen plasma producing gas and a silane compound gas, and removing the resist film while etching the fluorine containing carbon film by the produced plasma.

The third invention of the present application is characterized by the steps of: depositing an insulator film of a fluorine containing carbon film on an object to be treated; depositing a protective coat resistant to an oxygen plasma, on the insulator film; forming a pattern of a resist film on the protective coat; etching the protective coat, which is exposed so as to correspond to the pattern of the resist film, to remove the protective coat; and removing the resist film while etching the fluorine containing carbon film by an oxygen plasma. In this case, the protective coat may be an insulator film or a conductive film.

The fourth invention of the present application is characterized by the steps of: depositing an insulator film of a fluorine containing carbon film on an object to be treated; depositing a titanium nitride film on the insulator film; forming a pattern of a resist film on the insulator film; etching the titanium nitride film, which is exposed so as to correspond to the pattern of the resist film, to remove the titanium nitride film; and removing the resist film while etching the fluorine containing carbon film by an oxygen plasma.

In the above cases, when a metal layer is formed below the fluorine containing carbon film, oxide on the metal layer is preferably removed by argon plasma after the fluorine containing carbon film is etched to expose the metal layer.

BEST MODE FOR CARRYING OUT THE INVENTION

Figure 1:
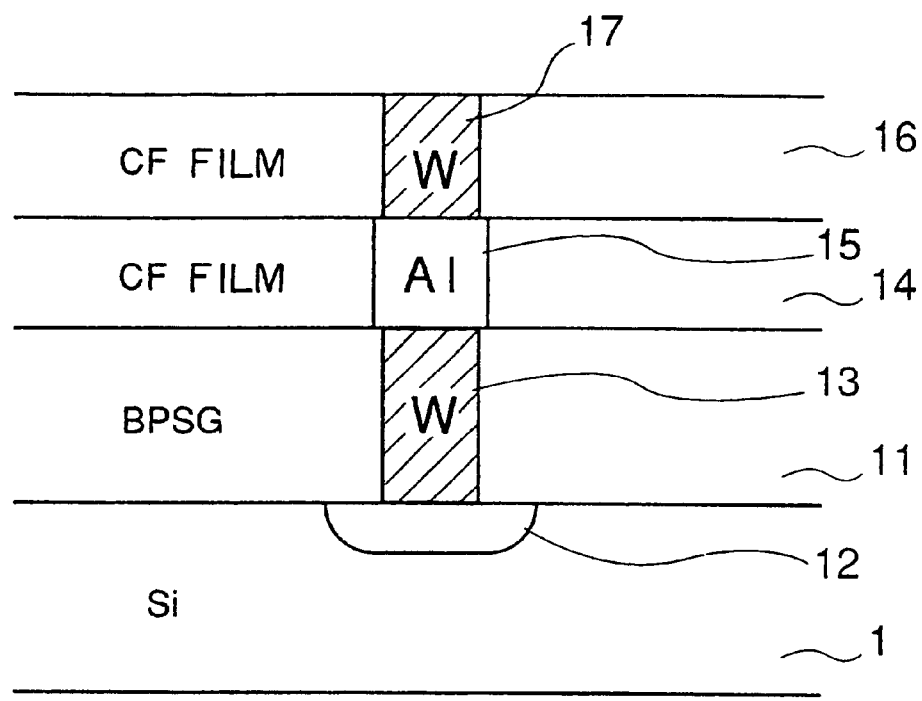
FIG. 1 is a schematic diagram drawing showing a part of a semiconductor device produced by a method according to the present invention.

Although the preferred embodiments of the present invention are characterized by a process for etching a fluorine containing carbon film (for example, such as a fluorocarbon film) (which will be hereinafter referred to as a "CF film"), an example of the structure of a semiconductor device produced by utilizing a method according to the present invention is shown in FIG. 1. Reference number 1 denotes a silicon substrate, and 11 denotes a BPSG film (a film obtained by doping P and B into $SiO_2$). Reference number 12 is an n-type semiconductor region, and 13 denotes an electrode of, e.g., W (tungsten), which is embedded into a through hole of the BPSG film 11. These correspond to a part of a principal part of a circuit. On the principal part of the circuit, an interconnection layer 15 of, e.g., aluminum, is formed as a multilayer. The lower interconnection layer 15 is connected to an upper interconnection layer 15 (not shown) by means of a conductive layer 17 of, e.g., W, which is embedded into a via hole formed in an interlayer insulator film 16.

Figure 2:
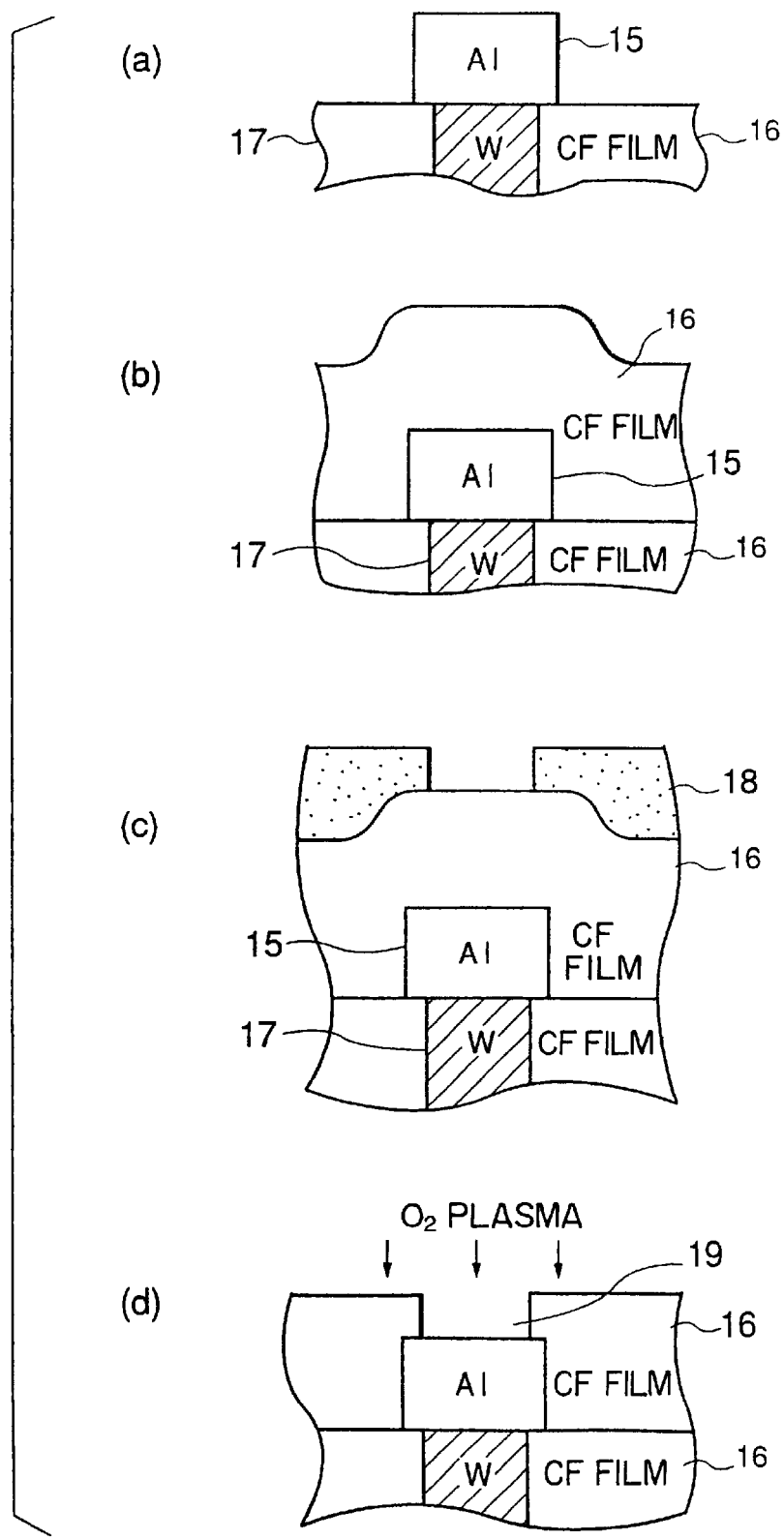
FIG. 2 is a schematic diagram showing a preferred embodiment of a method according to the present invention.

In order to produce such a semiconductor device, a process for etching the interlayer film will be described below. FIG. 2(a) shows the state where, e.g., a number n interconnection layer of aluminum, is formed. As shown in FIG. 2(b), a first interlayer insulator film 16 of a CF film is formed on an insulator film 14. The CF film can be deposited by the plasma CVD (Chemical Vapor Deposition) method using, e.g., a CF gas and a CH gas, as thin film deposition gases. For example, a CF film having a thickness of, e.g., 0.7 $\mu$m, is deposited with $C_4F_8$ gas and $C_2H_4$ gas by means of an ECR (Electron Cyclotron Resonance) plasma treatment system, which also serves as an etching system and which will be described later.

Then, as shown in FIG. 2(c), a resist film 18 of a predetermined pattern is formed on the surface of the CF film (the interlayer film 16). This resist film 18 is formed by applying a resist solution on the surface of the wafer using, e.g., the spin coating method, and then, carrying out exposure and development processes. The materials of the resist include organic materials, such as azide compounds, polyvinyl phenols, methacrylic acid compounds, novolak resins and polystyrene resins.

Thereafter, the surface of the wafer is irradiated with $O_2$ plasma (oxygen plasma) to etch the CF film. When the $O_2$ plasma strikes the CF film, an active species of $O_2$ cuts C—F bonds and C—C bonds to scatter as CO or $CO_2$, and F also scatters as $F_2$ and so forth. Thus, the CF film is chemically etched with the $O_2$ plasma.

By the way, since the resist film 18 is an organic material, the resist film 18 is also chemically etched with the $O_2$ plasma. Therefore, the etching of the CF film and the removing of the resist film 18 during the etching progress simultaneously. However, if the etching from the surface of the CF film to the aluminum interconnection layer 15 is completed before all the resist film 18 is removed by the etching, a predetermined via hole 19 is formed as shown in FIG. 2(d). In order to accomplish this, the rate for removing the resist film 18 by the etching and the etch rate of the CF film may be previously recognized to set the thickness of the resist film 18.

If the rate for removing the resist film 18 by the etching is equal to the etch rate of the CF film, the surface of the CF film is planarized. In order to planarize the surface of the interlayer insulator film after removing the resist film 18, a mechanical polishing process called CMP is generally carried out. However, in the above case, there is an advantage in that it is not required to carry out the CMP process. When the rate for removing the resist film by the etching is different from the etch rate of the CF film, it is desired to prevent all the resist film 18 from being removed before a predetermined hole is formed (before the surface of aluminum is etched). If the resist film 18 remains when the hole is formed, it is possible to remove the resist film and to form the hole without changing the thickness of the CF film by detecting the etching end time of the resist film 18 on the basis of, e.g., the quantity of emission of CO and $CO_2$.

Figure 3:
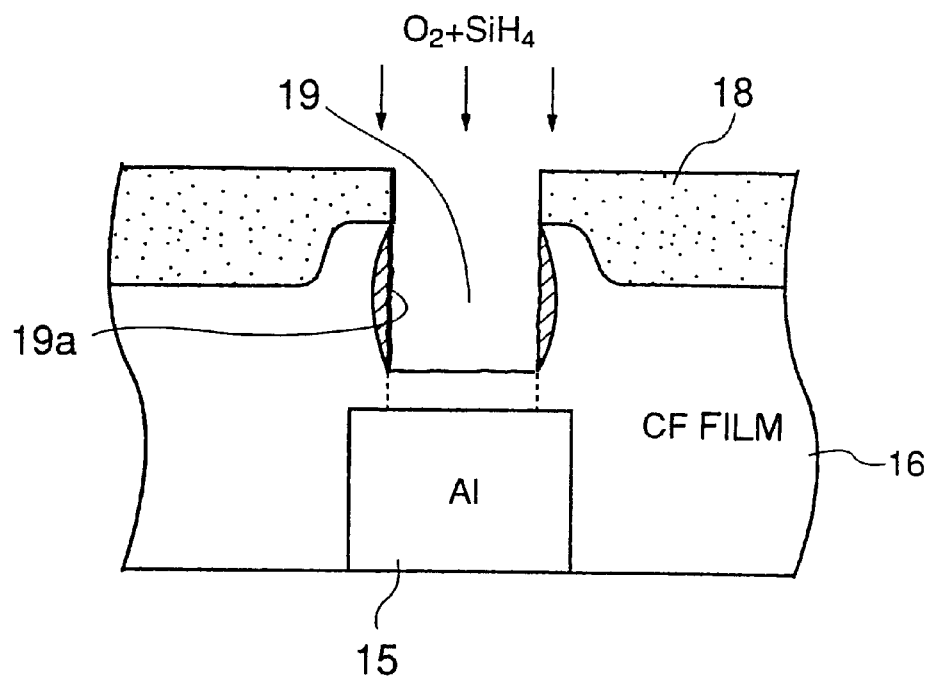
FIG. 3 is a schematic diagram showing another preferred embodiment of a method according to the present invention.

In another preferred embodiment of the present invention, the CF film is etched with $O_2$ gas and a silane gas, such as $SiH_4$ or $Si_2H_6$ gas, as shown in FIG. 3. FIG. 3 shows the state of such an etching. Simultaneously with the etching, a protective coat 19a of $SiO_2$ is formed on the side wall of the hole 19 by the reaction of $SiH_4$ with $O_2$, and the etching of the wide walls is inhibited.

Figure 4:
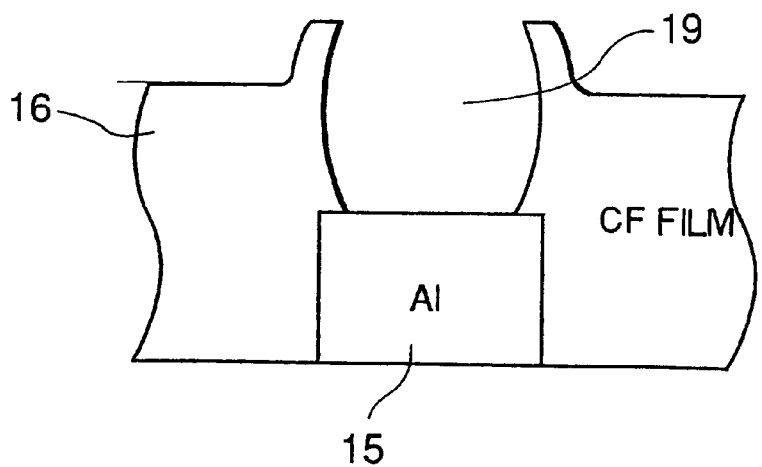
FIG. 4 is a schematic diagram showing a method compared with a method according to the present invention.

When the etching is carried out by only $O_2$ gas, the side wall of the recessed portion 19 is also etched so that the recessed portion 19 expands laterally as shown in FIG. 4. This state is called bowing. Therefore, it is conceived that it is difficult to etch the recessed portion 19 of a high aspect ratio. According to the above technique, it is possible to etch a via hole or a through hole, which have a high aspect ratio. In this case, if the ratio of the silane gas to the $O_2$ gas is great, the protective coat grows excessively to deteriorate the shape of the recessed portion, so that it is required to set the mixing ratio of the silane gas in accordance with the etching conditions. This method may be combined with a method for forming an insulator film or a conductive film, which will be described later, on the surface of a CF film to be carried out.

Figure 5:
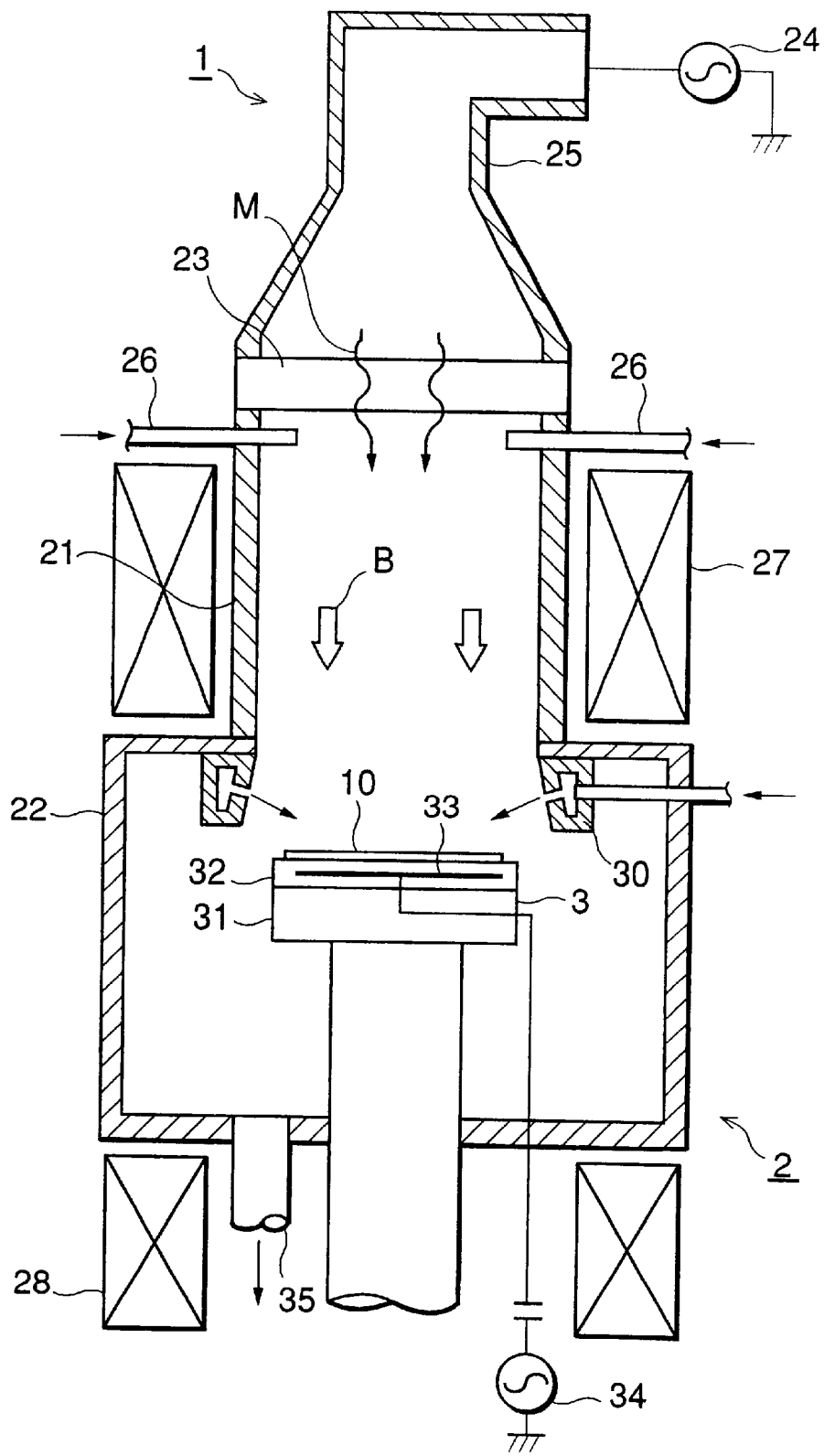
FIG. 5 is a longitudinal section of an example of a plasma treatment system for carrying out a method according to the present invention.

The method of the present invention may be carried out by means of a plasma treatment system shown in FIG. 5. This system has a vacuum vessel 2 formed of aluminum or the like. The vacuum vessel 2 comprises: a cylindrical plasma chamber 21, which is arranged at an upper position, for producing plasma; and a cylindrical treatment chamber 22, which is arranged below the plasma chamber 21 to be communicated therewith and which has a larger diameter than that that of the plasma chamber 21. Furthermore, the vacuum vessel 2 is grounded to have zero potential.

The upper end of the vacuum vessel 2 is open. In this portion, a transmission window 23 of a material capable of transmitting a micro wave, e.g., quartz, is airtightly provided so as to maintain the vacuum state in the vacuum vessel 2. Outside of the transmission window 23, there is provided a waveguide 25 which is connected to a high-frequency power supply part 24 serving as a high-frequency supplying means for producing plasma of, e.g., 2.45 GHz. The micro wave M produced by the high-frequency power supply part 24 is guided by the waveguide 25 to be introduced from the transmission window 23 into the plasma chamber 21. On the side wall for dividing the plasma chamber 21, plasma gas nozzles 26 are arranged, e.g., at regular intervals in the circumferential directions thereof.

Around the outer periphery of the side wall for dividing the plasma chamber 21, a magnetic field forming means, e.g., a ring-shaped main electromagnetic coil 27, is arranged so as to adjacent to the outer periphery of the side wall. Below the thin film deposition chamber 22, a ring-shaped auxiliary electromagnetic coil 28 is arranged. Thus, a magnetic field extending downwards from the plasma chamber 21 to the treatment chamber 22, e.g., a magnetic field B of 875 gausses, can be formed so as to meet the ECR plasma conditions. Furthermore, permanent magnets may be substituted for the electromagnetic coils.

Thus, the micro wave M having a controlled frequency and the magnetic field B are formed in the plasma chamber 21 to produce the ECR plasma by the interaction between the micro wave M and the magnetic field B. At this time, the resonance function occurs in the introduced gases at the aforementioned frequency to form a plasma at a high density. That is, this system forms an electron cyclotron resonance (ECR) plasma treatment system.

The mounting table 3 comprises a body 31 of, e.g., aluminum, and a ceramics body 33, which has a heater 32 therein and which is arranged on the body 31. The mounting surface functions as an electrostatic chuck. To the body 31 of the mounting table 3, e.g., a high-frequency power supply part 34 for applying a bias voltage to draw ions into the wafer W is connected. An electrode for the bias voltage also serves as, e.g., an electrode for the electrostatic chuck. To the bottom of the vacuum vessel 2, an exhaust pipe 35 is connected. Furthermore, reference number 30 denotes a ring-shaped thin film deposition gas supplying part for use in the thin film deposition treatment.

A method for etching the wafer 10 serving as an object to be treated, using the above described system, will be described below. First, a gate valve (not shown) provided in the side wall of the vacuum vessel 2 is open, and the wafer 10 is introduced from a load-lock chamber (not shown) to be transferred onto the mounting table 3 by means of a transport arm (not shown).

Subsequently, after the gate valve is closed to seal the interior of the vacuum vessel 2, the internal atmosphere is exhausted through the exhaust pipe 35 to evacuate the interior of the vacuum vessel 2 to a predetermined degree of vacuum, and $O_2$ gas is introduced into the plasma chamber 21 from the plasma gas nozzle 26 as well as a silane gas, e.g., $SiH_4$ gas, is introduced into the plasma chamber 21 from the thin film deposition gas supplying part 30. Then, the pressure in the vacuum vessel 2 is maintained to be a predetermined process pressure, and a bias voltage of 13.56 MHz is applied to the mounting table 3 by means of the high-frequency power supply part 34.

A high frequency wave (micro wave) of 2.45 GHz produced from the plasma producing high-frequency power supply part 24 is carried in the waveguide 25 to reach the ceiling part of the vacuum vessel 2 to pass through the transmission window 23, so that the micro wave M is introduced into the plasma chamber 21. In the plasma chamber 21, a magnetic field B of, e.g., 875 gausses, which is produced by the electromagnetic coils 27 and 28, is applied from top to bottom. The interaction between the magnetic field B and the micro wave M induces E (electric field)×B (magnetic field) to cause electron cyclotron resonance, which produce a plasma of $O_2$ gas and increase the density thereof.

The plasma flow, which has flowed into the treatment chamber 22 from the plasma production chamber 21, is drawn into the wafer 10 by the bias voltage, so that the surface of the wafer 10 is etched.

The inventor used the plasma treatment system shown in FIG. 5 to prepare the wafer 10, on which a CF film was formed using $C_4F_8$ gas and $C_2H_4$ gas as thin film deposition gases and Ar gas as a plasma gas to form a pattern on the CF film by a resist film of an azide compound by means of a resist treatment system and an exposure system. Using the plasma treatment system, $O_2$ gas was supplied to the wafer 10 from the plasma nozzle 26 at a flow rate of 100 sccm to form a hole having a width of 0.3 µm and an aspect ratio of 1 and simultaneously to etch the resist film. In this case, the process pressure was 0.2 Pa, and the micro wave power was 2500 W. In addition, the bias voltage was 1500 W, and the surface temperature of the mounting table 3 was 270° C.

Etching was carried out on the same conditions except that $SiH_4$ gas was supplied at 2 sccm, so that a good hole having an aspect ratio of 2 was formed.

Another preferred embodiment of the present invention will be described below. In this preferred embodiment, a conductive film, e.g., TiN (titanium nitride) film 41, which has a thickness of, e.g., 300 angstrom, is formed on the surface of a CF film 4 having a thickness D of, e.g., 8000 angstrom, as shown in FIG. 6(a). This TiN film 41 can be deposited with Ar gas and $N_2$ gas by the reactive sputtering using, e.g., Ti, as a target.

Figure 6:
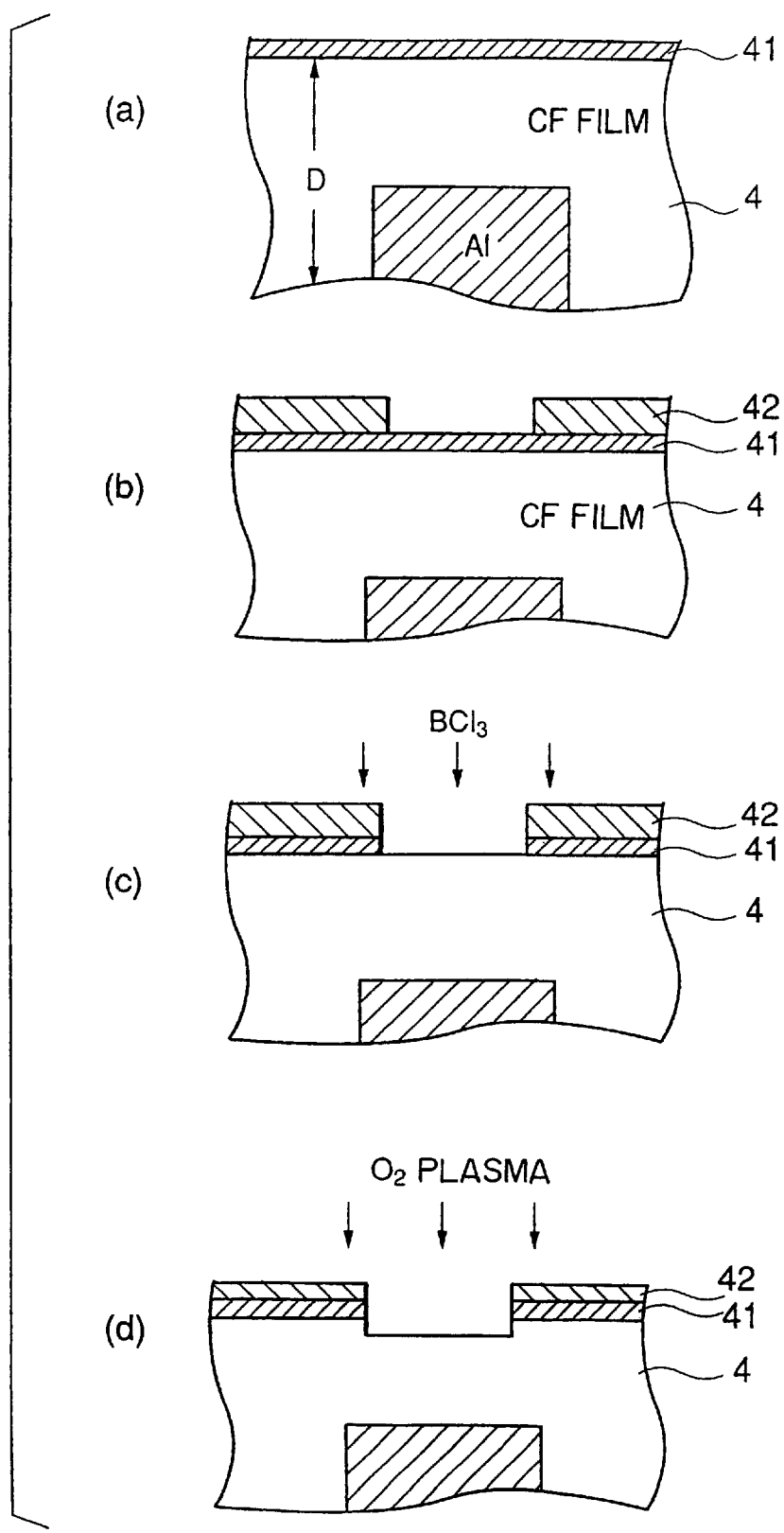
FIG. 6 is a schematic diagram showing another preferred embodiment of the present invention.

Subsequently, a mask is formed on the surface of the TiN film 41 by the resist film 42 (FIG. 6(b)). Furthermore, the swell of the CF film is omitted in FIG. 6. Thereafter, the TiN film 41 is etched to the surface of the CF film 4 with a plasma of, e.g., $BCl_3$ gas, as shown in FIG. 6(c). This etching can be carried out by means of, e.g., the above described plasma treatment system. Then, the surface of the wafer is irradiated with $O_2$ plasma to etch the CF film 4 as well as to remove the resist film 42 by the etching (FIG. 6(d)).

Figure 7:
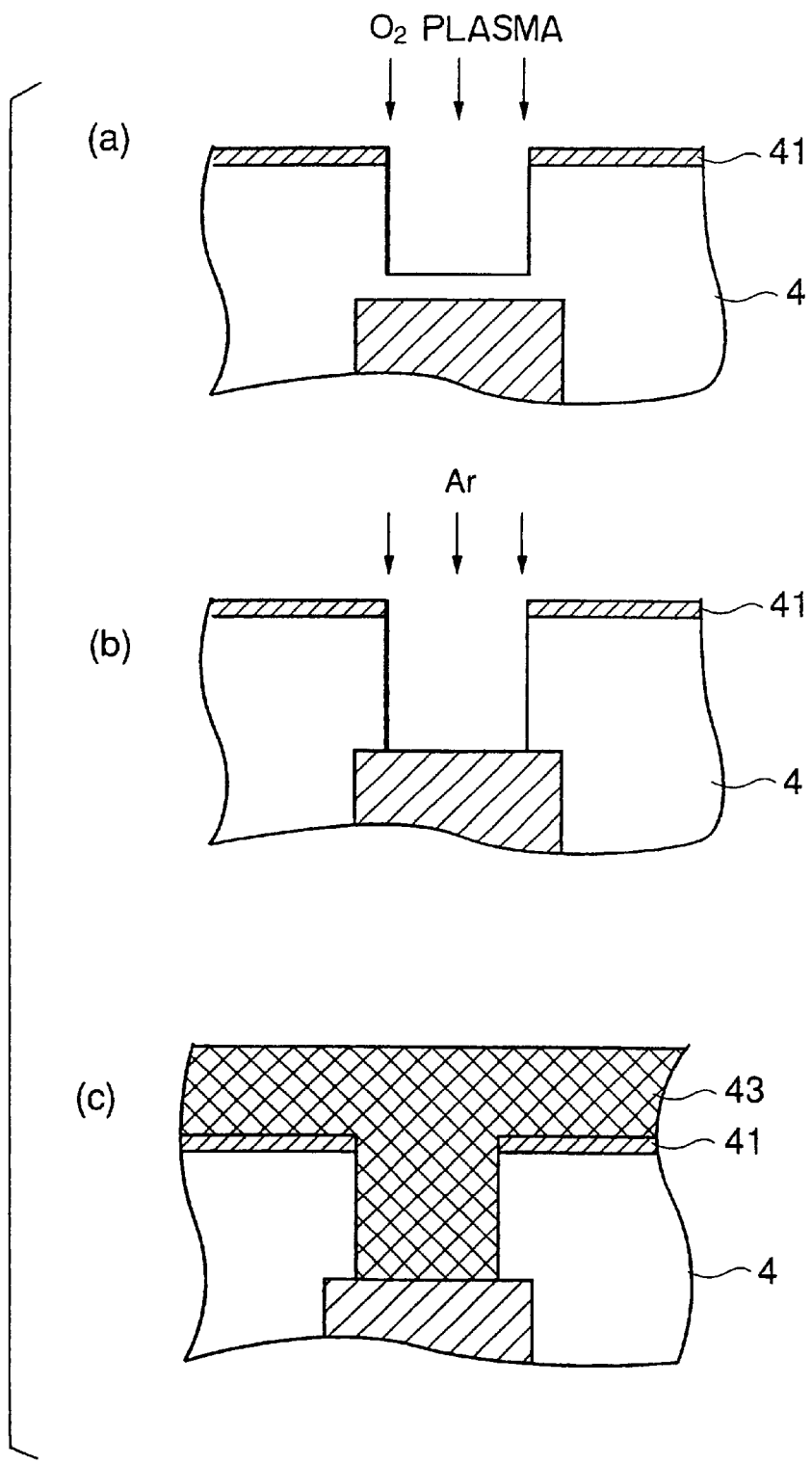
FIG. 7 is a schematic diagram showing another preferred embodiment of the present invention.

After the resist film 42 is removed, the TiN film 41 can function as a mask to etch only a region of the CF film corresponding to the pattern, so as to a predetermined via hole and a predetermined through hole (FIG. 7(a)). When the etching of the CF film is completed to expose the surface of the interconnection layer of aluminum, $O_2$ gas is switched to Ar gas to remove oxide from the surface of the interconnection layer of aluminum by the sputter etching using Ar ions (FIG. 7(b)). Thereafter, a metal 43, such as tungsten (W), is embedded into the hole to form an interconnection layer as well as to form, e.g., a second interconnection layer (FIG. 7(c)). The embedding into the hole and the deposition of the interconnection layer may be carried out by the sputtering using aluminum.

According to such a method, the CF film can be etched even if both of the resist film and the CF film do not resist to the $O_2$ plasma since the TiN film 41 functions as a so-called hard mask. In addition, since the resist film 42 is removed during the etching of the CF film, it is required to carry out a process for removing the resist film 42 by the $O_2$ ashing serving as a post-treatment. When the tungsten layer and the aluminum layer are formed on the CF film, the TiN film 41 functions as an adhesion layer for causing these metal layers to adhere to the CF film. Therefore, the resist film 42 does not have bad influence, so that it is not required to remove the resist film 42. Furthermore, when undesired portions of the TiN film 41 can be removed simultaneously with the deposition of the interconnection layer, i.e., the etching of the metal layer.

When the metal layer is formed on the surface of the insulator film, the adhesion layer is originally required, and TiN is conventionally used as the adhesion layer. Therefore, the method using TiN as a hard mask is an effective method since the method also forms the adhesion layer simultaneously. In addition, since TiN is a conductive layer, it can be regarded as a part of the interconnection layer without being contained on the side of the interlayer insulator film, so that it is possible to prevent the relative dielectric constant of the interlayer insulator film from increasing. Moreover, even if the interconnection layer of aluminum is broken, the waveguide is insured by the TiN film underlying the interconnection layer, so that it is possible to prevent the defective operation of the device. The conductive film may be made of any one of Al, W, Ti, TiW, TiWN and polysilicon, in addition to TiN.

According to the present invention, an insulator film may be used as the hard mask in place of the conductive film. The material of the insulator film may be, e.g., $SiO_2$, SiOF or $Si_3N_4$. In this case, at a step of etching the insulator film (the above described step corresponding to FIG. 6(c)), the insulator film is etched with, e.g., fluorine radicals using $CF_4$ gas.

Since the hard mask is a part of the interlayer insulator film, the next step, e.g., the step of embedding aluminum and tungsten, may be carried out without removing the hard mask. Alternatively, all of the insulator film may be removed by, e.g., the wet etching using HF solution. When the insulator film is used as a hard mask, the insulator film functions as a hard mask if the thickness thereof is not less than, e.g., 100 angstrom. However, if the thickness is too great when the insulator film remains in the device, the total relative dielectric constant of the interlayer insulator film including the insulator film is great, so that it is conceived that the thickness of the insulator film is preferably less than or equal to about one-third of the thickness of the CF film.

Figure 8:
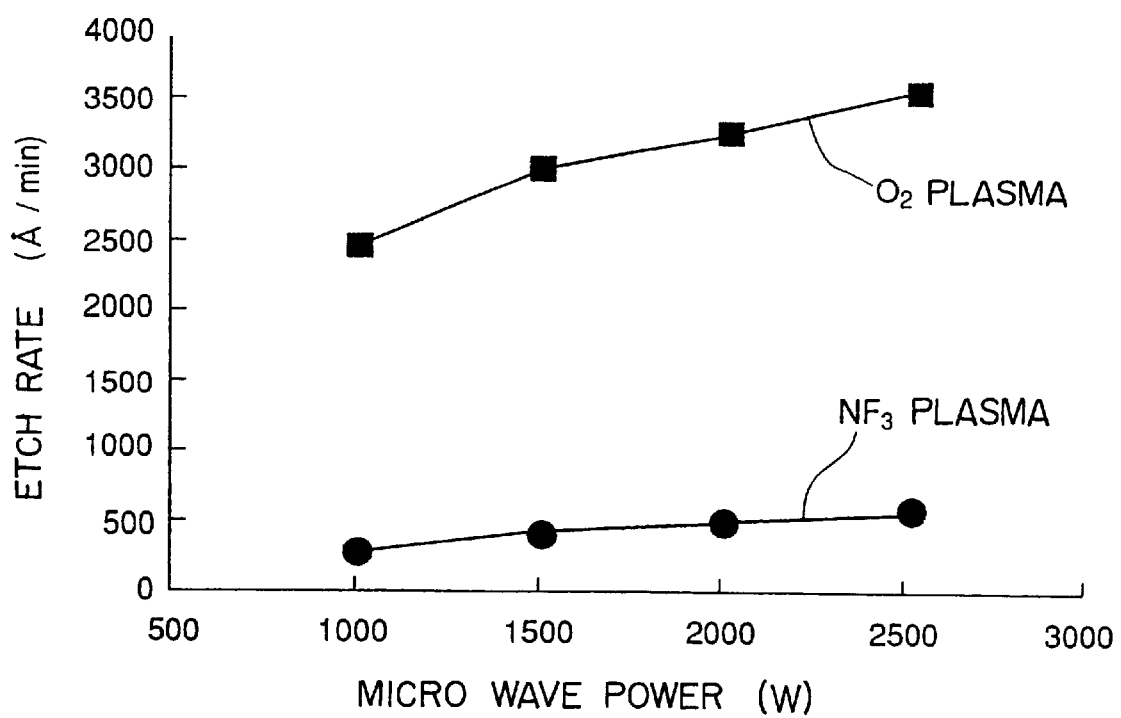
FIG. 8 is a characteristic diagram showing etching characteristics of a CF film.

FIG. 8 shows the results of the etching characteristics when etching the CF film with $O_2$ plasma and $NF_3$ plasma by means of the system shown in FIG. 5. It can be understood from this figure that $O_2$ plasma is effective for the etching of the CF film.

As described above, according to the present invention, it is possible to carry out the pattern etching of a CF film and to put an interlayer insulator film of, e.g., a CF film, into practice.

What is claimed is:

1. A method for producing a semiconductor device, which comprises the steps of:

depositing an insulator film of a fluorine containing carbon film as an interlayer insulator film on an object to be treated;

forming a pattern of a resist film on said insulator film so that a thickness of said resist film is not larger than a thickness of said insulator film;

producing an oxygen plasma of a treatment gas containing an oxygen plasma producing gas; and removing said resist film while etching said insulator film by said oxygen plasma, wherein an etch rate of said fluorine containing carbon film when etched by the said oxygen oxide plasma is equal to an etch rate of said resist film when etched by the said oxygen plasma.

2. The method for producing a semiconductor device, as set forth in claim 1, wherein said treatment gas further includes a silane compound gas.

3. A method for producing a semiconductor device, which comprises the steps of:

depositing an insulator film of a fluorine containing carbon film as an interlayer insulator on an object to be treated, a metal wiring being buried in the insulator film;

forming a pattern of a resist film on said insulator film so that a thickness of said resist film is not larger than a thickness of said insulator film;

producing an oxygen plasma of a treatment gas containing an oxygen plasma producing gas; and removing said resist film positioned above the metal wiring to reveal a surface of the metal wiring while etching said insulator film by an oxygen plasma, wherein an etch rate of said fluorine containing carbon film when etched by the oxide plasma is equal to an etch rate of said resist film when etched by the oxide plasma.

* * * * *